US011101191B2

(12) United States Patent
Sikka et al.

(10) Patent No.: US 11,101,191 B2
(45) Date of Patent: Aug. 24, 2021

(54) LAMINATED CIRCUITRY COOLING FOR INTER-CHIP BRIDGES

(71) Applicant: International Business Machines Corporation, Armonk, NY (US)

(72) Inventors: Kamal K. Sikka, Poughkeepsie, NY (US); Hiroyuki Mori, Yasu (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/693,213

(22) Filed: Nov. 22, 2019

(65) Prior Publication Data

US 2021/0159141 A1    May 27, 2021

(51) Int. Cl.
*H01L 23/367* (2006.01)
*H01L 25/065* (2006.01)
(Continued)

(52) U.S. Cl.
CPC .......... *H01L 23/3675* (2013.01); *H01L 23/13* (2013.01); *H01L 23/3735* (2013.01); *H01L 23/49866* (2013.01); *H01L 23/5381* (2013.01); *H01L 23/5385* (2013.01); *H01L 23/5386* (2013.01); *H01L 24/16* (2013.01); *H01L 24/32* (2013.01); *H01L 24/73* (2013.01); *H01L 25/0655* (2013.01);
(Continued)

(58) Field of Classification Search
CPC . H01L 23/3675; H01L 23/13; H01L 23/3735; H01L 23/49866; H01L 23/5381; H01L 23/5385; H01L 23/5386; H01L 24/16; H01L 24/32; H01L 24/73; H01L 25/0655; H01L 2224/16227; H01L 2224/32225; H01L 2224/73253
See application file for complete search history.

(56) References Cited

U.S. PATENT DOCUMENTS 8,083,704 B2    12/2011    Jensen et al.
8,232,636 B2    7/2012    Humenik et al.
(Continued)

FOREIGN PATENT DOCUMENTS

JP    2004327624    11/2004
WO    WO2018004692 A1    1/2018

OTHER PUBLICATIONS

"Thermal performance evalutation of dual-side cooling for a three-dimensional (3D) chip stack: Additional cooling from the laminate (substrate) side" Keiji Matsumoto; Hiroyuki Mori; Yasumitsu Orii 2016 International Conference on Electronics Packaging (ICEP) Year: 2016, pp. 163-168.

*Primary Examiner* — Peniel M Gumedzoe
(74) *Attorney, Agent, or Firm* — Daniel P. Morris; Lou Percello, Attorney, PLLC (57) ABSTRACT

The present invention includes embodiments of a semiconductor package designed to transfer heat from one or more bridges within the package to ambient external to the package in addition to conducting the heat through any semiconductor chips encapsulated within the package. A laminated substrate has one or more horizontal layer heat conduction paths and one or more vertical substrate heat conduction paths. The vertical substrate heat conduction paths collect heat from one or more of the horizontal layer heat conduction paths, and eventually conduct the heat out of the semiconductor package, e.g. into a lid or heat sink.

18 Claims, 4 Drawing Sheets

(51) Int. Cl.
  *H01L 23/538* (2006.01)
  *H01L 23/373* (2006.01)
  *H01L 23/498* (2006.01)
  *H01L 23/00* (2006.01)
  *H01L 23/13* (2006.01)

(52) U.S. Cl.
  CPC ............ *H01L 2224/16227* (2013.01); *H01L 2224/32225* (2013.01); *H01L 2224/73253* (2013.01)

(56) References Cited

U.S. PATENT DOCUMENTS

| | | |
|---|---|---|
| 8,310,067 B2 | 11/2012 | Zhao et al. |
| 8,427,833 B2 | 4/2013 | Barowski et al. |
| 9,379,090 B1 | 6/2016 | Syed et al. |
| 9,385,083 B1 | 7/2016 | Herrault et al. |
| 9,666,559 B2* | 5/2017 | Wang .................... H01L 25/18 |
| 9,806,002 B2 | 10/2017 | Choudhury et al. |
| 10,026,672 B1 | 7/2018 | Herrault et al. |
| 2010/0327424 A1* | 12/2010 | Braunisch ............... H01L 23/13 257/692 |
| 2015/0340353 A1 | 11/2015 | Starkston et al. |
| 2019/0051642 A1* | 2/2019 | Gupta Hyde ......... H01L 25/105 |
| 2020/0185300 A1* | 6/2020 | Xu ........................ H01L 23/053 |
| 2020/0286809 A1* | 9/2020 | Gong .................. H01L 23/5386 |

* cited by examiner

LAMINATED CIRCUITRY COOLING FOR INTER-CHIP BRIDGES

BACKGROUND

The present invention relates to cooling microelectronic circuitry. More specifically, the invention relates to cooling microelectronic circuitry in inter-chip bridge connectors that electrically connect two or more semiconductor chips.

Inter-chip silicon or other material bridges are used to connect semiconductor chips (chips) for high-bandwidth low-latency signal transmission.

The inter-chip bridges are usually placed under the chips. Some bridges are active, i.e., the bridge contains active components that produce heat in addition to heat produced by the chips. Any heat dissipated in the bridge has to conduct through the bridge-chip interconnects and then through the overlying chips. This adds thermal resistance to the heat conducting paths from the bridges and increases their temperature.

Rising temperatures due to inefficient heat removal can cause the circuitry in the bridge connectors to fail.

There is a need for new designs, structures, and methods to remove heat effectively from bridges connecting semiconductor chips.

SUMMARY

The present invention includes embodiments of a semiconductor package designed to transfer heat away from one or more bridges within the package to ambient external to the package. Methods of heat transfer are also disclosed.

The package has two or more semiconductor chips (chips). Each chip has one or more external electrical connections. One or more of the bridges electrically connects one or more of the electrical connections on a first chip to one or more electrical connections on a second chip. The bridge, if active, produces heat while the chips and bridge are operating. The bridge is thermally connected with a thermal interface material (TIM) to an underlying laminated substrate for the chips.

A laminated substrate of the package has metal lines and vias embedded in dielectric layers. In addition to metal lines and vias required for electrical connectivity, additional horizontal metal lines and vertical vias are purposely included to thermally connect to the bridge and conduct heat to a lid attached to the top surface of the laminate at its periphery. The lid is attached to the laminate top surface with an adhesive.

In some embodiments a lid made of heat conducting material has one or more legs. At least one of the legs is adhesively connected to a top of the laminated substrate at an edge or extremity of the laminated structure. In some embodiments, a solder metal may surround the adhesive to improve the heat conduction. The lid is in thermal contact with the chips through a thermal interface material. In some other embodiments, a stiffener ring may be used instead of the lid.

DETAILED DESCRIPTION

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element.

As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Unless otherwise specifically noted, the same reference numbers in different figures have the same description and refer to the same elements. Once presented, reference numbers may be omitted in later Figures for clarity.

The Figures are not drawn to scale.

Some electronic packages have one or more chips, a bridge, a substrate, and a lid. The chips, bridge, and substrate typically have a plurality of connections. The connections include contact pads, chip-substrate C4 connectors, chip-bridge connectors, and substrate metal lines, metal planes, and vias.

An embodiment of the present invention has a substrate that is a laminated substrate structure. The laminated substrate may have a central core material layer which is drilled to create holes which are plated and filled to create plated through holes (PTHs). Copper is then deposited on both sides of the core layer. Photoresist is then applied, exposed, and developed. The copper is then etched into required lines and planes and the photoresist is then stripped away. A dielectric material in film form is then applied and laminated under pressure. Through-vias are then laser drilled in the dielectric layers and the vias are copper-plated to connect to the underlying metal lines or planes. This process of forming metal lines or planes and vias is repeated to form multiple layers of circuitry in the laminate. The inter-layer vias can be vertically stacked or offset vertically. A solder mask material is applied on the top and bottom surfaces of the laminated substrate.

The solder mask material then goes through a lithographic process and is plated with solder to form pads for connection to chips on the top side and printed circuit boards on the bottom side.

The metal lines, planes, vias, and PTHs provide electrically connectivity between the top and bottom surfaces of the laminate substrate. Being metallic, these lines, planes, vias, and PTHs are also thermally conductive. Intentionally added connections create additional heat conduction paths in the substrate. The metal lines and planes provide horizontal heat conducting paths while the vias provide vertical heat conducting paths. The heat conductive paths move heat away from the bridge connector and chips to extremities of the package where the heat is directed to the lid.

In some embodiments, the bridges reside within trenches in the laminated substrate. A heat conductive thermal interface material (TIM) is disposed between the bridge and the top surface of the laminate solder mask. In some embodiments the TIM material is a grease or a gel that cures during package assembly.

In some embodiments, the bridges reside above the top surface of the laminated substrate. A high thermal conductivity adhesive film can be applied between the bottom of the bridge and the top of the laminated substrate.

The remaining part of the package structure is similar to a non-bridge package. An underfll is used to encapsulate the C4 interconnects between the chip and the laminated substrate. A lid or stiffener ring is adhesively attached to the top surface periphery of the laminated substrate. A TIM is disposed between the chips and the lid inner surface.

Figure 1:
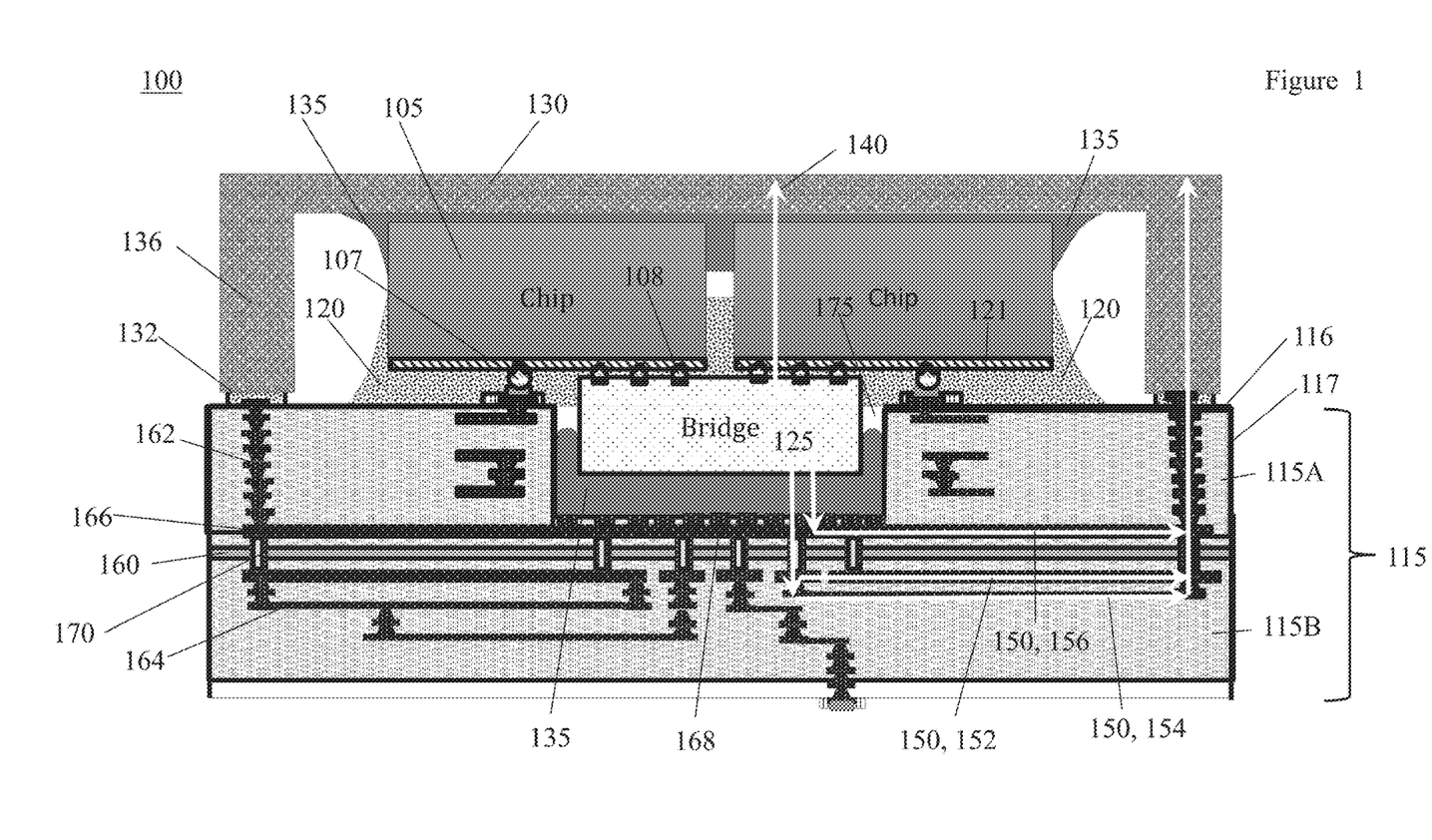
FIG. 1 is an elevation view of one embodiment of a semiconductor package having two or more semiconductor chips (chips), a connecting bridge, and a laminated substrate with purposefully added metal lines and vias for heat conduction enhancement, and a lid.

Refer now to FIG. 1. FIG. 1 is an elevation view of one embodiment of a semiconductor package having two or more semiconductor chips 105, a connecting bridge 125, and a laminated substrate 115 with metal lines, planes, and vias purposefully included for heat conduction enhancement.

The chips 105 or flip chips 105 have one or more chip connections (e.g. 107, 108) that connect the electronics internal to the chip 105 to external circuitry. Some chip connections 108 connect the chip 105 to the bridge 125. Other chip connections 107 can connect the chip 105 to other external circuitry and/or external connections present on a laminated substrate, typically 115. These chip connections (107, 108) are well known and include C4 or Cu pillar contacts.

In some embodiments, the volume between the chips 105 and the substrate 115 is filled with an underfill 120. The underfill 120 provides some structural integrity to the package 100 and can provide some path for heat/thermal conduction. The chip back end of the line (BEOL) 121 represents the chip circuitry connecting the transistors to the interconnects (107, 108).

A heat sink or lid 130 is placed over and/or can enclose some or all of the package 100. The lid 130 is made of a material with good heat conductivity and is in thermal contact with the chips 105 and, in some embodiments, is also in contact with other parts of the package 100.

Often a thermal interface material (TIM) 135 is placed between the surface(s) of the chip 105 and the (underside) surfaces of the lid 130 to improve thermal conductivity between the chip 105 and the lid 130. In some embodiments, a lid adhesive 132 is used to adhere the lid 130 to parts of the package 100, e.g. to a surface 116 of the substrate 115. The lid adhesive 132 can have good thermal conductivity. Lids 130, TIMs 135, underfills 120, and lid adhesives 132 are known.

The lid 130 provides structural integrity to the package 100 by reducing its warpage. In addition, the lid 130 provides a relatively large thermal mass for the package 100 and a large surface area through which heat is conducted/convected away from the chips 105 and other components in the package 100. In some embodiments, the lid 130 has one or more legs 136. These legs 136 can be in contact with extremities of the package 100, e.g. on the surface 116 near the package periphery 117.

In some embodiments the bridge 125 generates and/or absorbs heat and the bridge 125 is in thermal contact with the chips 105, e.g. through connections 108. In these cases, there is a primary heat conduction path 140 that passes from the bridge 125 through the chip 105, TIM 135, and lid 130 to dissipate away from the package 100.

However, this primary heat conduction path 140 has shortcomings in some designs. For example, in this pathway 140, heat generated outside of the chips 105, e.g. within the bridge 125, passes through the chip 105. This added heat passing through the chip 105 has the undesirable effect of increasing the temperature of the chip 105. In addition, as the circuitry in the chips 105 and bridges 125 become denser, the heat generation goes up in these devices tending to raise the temperature of the chips 105 even more. As a result, the primary heat conduction path 140 may be unable to conduct easily all the generated heat from both the chips 105 and the bridge 125 to elsewhere in the package 100 and eventually to ambient.

In the present invention a substrate 115 is in thermal contact with at least one side of the bridge 125 opposite from the chips 105. The substrate 115 has horizontal metal lines and planes (e.g., 152, 154, 156, 164, and 166, typically 150) and vertical vias 162 and PTHs 170 creating a plurality of substrate heat conduction paths. Substrate heat conduction paths 150 conduct heat out of the bridge 125 in a direction away from the chips 105. In some embodiments, the substrate heat conduction paths 150 conduct heat from the bridge 125 to extremities 117 of the package 100 that are cooler and away from the chip 105 throughout the entire path of the substrate heat conduction path 150. In some embodiments, the heat is conducted to these cooler extremities 117 to legs 136 of the lid 130 through a lid adhesive 132. In this way, the heat conducted from the bridge 125 avoids proximity to the chip 105 and therefore contributes less to chip 105 heating. Also, the heat is conducted more efficiently to a cooler region of the package 100 and lid 130 because of the increased temperature difference between the bridge 125 and package extremities.

The metal lines and planes 150, vias 162 and PTHs 170 may or may not be used for electrical connections. The cross-section areas of the metal lines and planes can vary depending on the amount of heat conduction required—larger cross-section areas conduct more heat than smaller cross-section areas, all other things being equal. The metal lines, planes, and vias are typically made of copper.

The heat conducting vias 162 can have different cross section areas, where the larger cross-sectional areas enable more heat conduction.

The heat conducting vias 162 can be vertically stacked or vertically offset and connected by metal lines 150. For example, a plurality of heat conducting vias 162 can be stacked or lined up in a direction into and out of the plane of FIG. 1 to increase the number of vias 162 and therefore heat flow capacity. In some embodiments, the vertical heat paths collect heat from one or more horizontal layer heat conduction paths and change the direction of the conduction 90 degrees, e.g. change the heat flow from horizontal to vertical.

In some embodiments, the bridges 125 are located in cavities 175 within the laminated substrate 115. The cavities 175 can be machined in the laminated substrate 115 by using a mechanical router. The cavity depth is precisely controlled by an electrical connection between the router and an external circuit. For example, the router tool can monitor first electrical contact with the vias 168 and stop removing material at this point. This method creates a precise depth of the cavity/trench 175 and is known.

The TIM 135 is deposited in the cavity 175 to a level and/or in an amount that allows the bridge 125 to be inserted into the cavity 175 while the TIM 135 covers the bottom and sides of the bridge 125 and contacts the vias 168.

The heat from the bridge 125 is conducted away from the chips 105 through the TIM 135 and to any one or more horizontal layer heat conductive paths made of metal lines and planes 150. In some embodiments, these horizontal layer heat conductive paths direct the heat to the cooler extremities of the package 100 and up vertical pathways, e.g. 162, on the extremities of the package 100. The vertical heat conductive pathways 162 can conduct the heat through a heat conductive adhesive 132 on the outer extremities 117 to legs 136 of the lid 130.

It will be noted that heat conductive pathways, typically 150 are shown only on one side of the figure for clarity. In practice, the heat conductive pathways conduct heat in the left and right directions and in directions into and out of the figure. In some embodiments, the lid 130 has legs 136 that attach all around the perimeter of the substrate 115 and heat can be directed to, and dissipated from, any or all of these locations on the lid 130.

It is also noted again that the horizontal heat conductive paths 150 and vertical heat conductive paths 162 can be located above and below the laminate core layer 160.

The invention is capable of cooling disparate components in the package 100. The horizontal and vertical heat conduction paths can be placed in different locations and layers, can be designed with different cross sections, and/or can have different numbers and cross-sections of paths. The substrate 115 can be custom designed to remove heat from different components with different heat loads located at different locations in the package 100. These components can be placed in cavities/trenches 175 or not.

Figure 2:
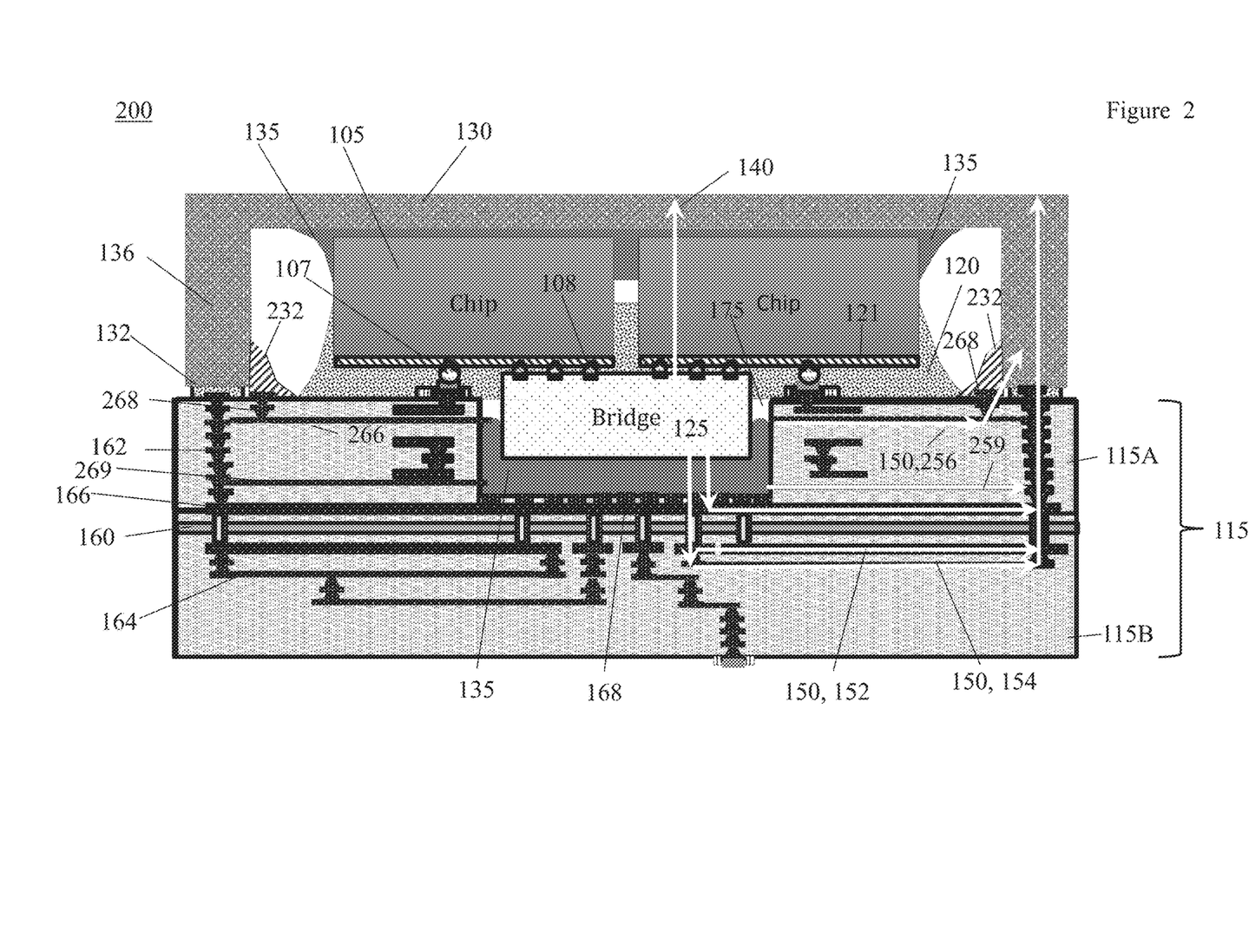
FIG. 2 is an elevation view of an alternative embodiment of a semiconductor package having two or more chips, a bridge, and a laminated substrate with purposefully added metal lines and vias for heat conduction enhancement, and a lid with solder metal around the lid attach adhesive.

FIG. 2 is an elevation view of an alternative embodiment of a semiconductor package 200 having two or more chips 105, a bridge 125, and a laminated substrate 115 with additional heat removal apparatus.

Package 200 has additional horizontal layer heat conduction paths, e.g. metal lines 266 and 269, layered within the substrate 115 that thermally connect the TIM 135 in the cavity/trench 175 with the stacked, vertical heat conducting vias 162. Accordingly, additional substrate heat conduction paths (256, 259, 150) are formed and move heat from the bridge 125 to the extremities of the package 200.

Additional vias 268 are added to conduct heat from substrate heat conduction path 256 through the substrate to a heat conductive paste 232 that is applied along the base of the legs 136 of the lid 130. The heat conductive paste 232 provides additional surface area through which heat can flow and additional surface area contact between the side of the lid 130, leg 136, and surface 116 of the substrate 115. The heat conductive paste 232 enables increased heat flow from the bridge to the extremities of the lid 130. Heat conductive pastes 232 are known and can include materials like solder alloys of metals such as copper, silver, tin and other metals.

Figure 3:
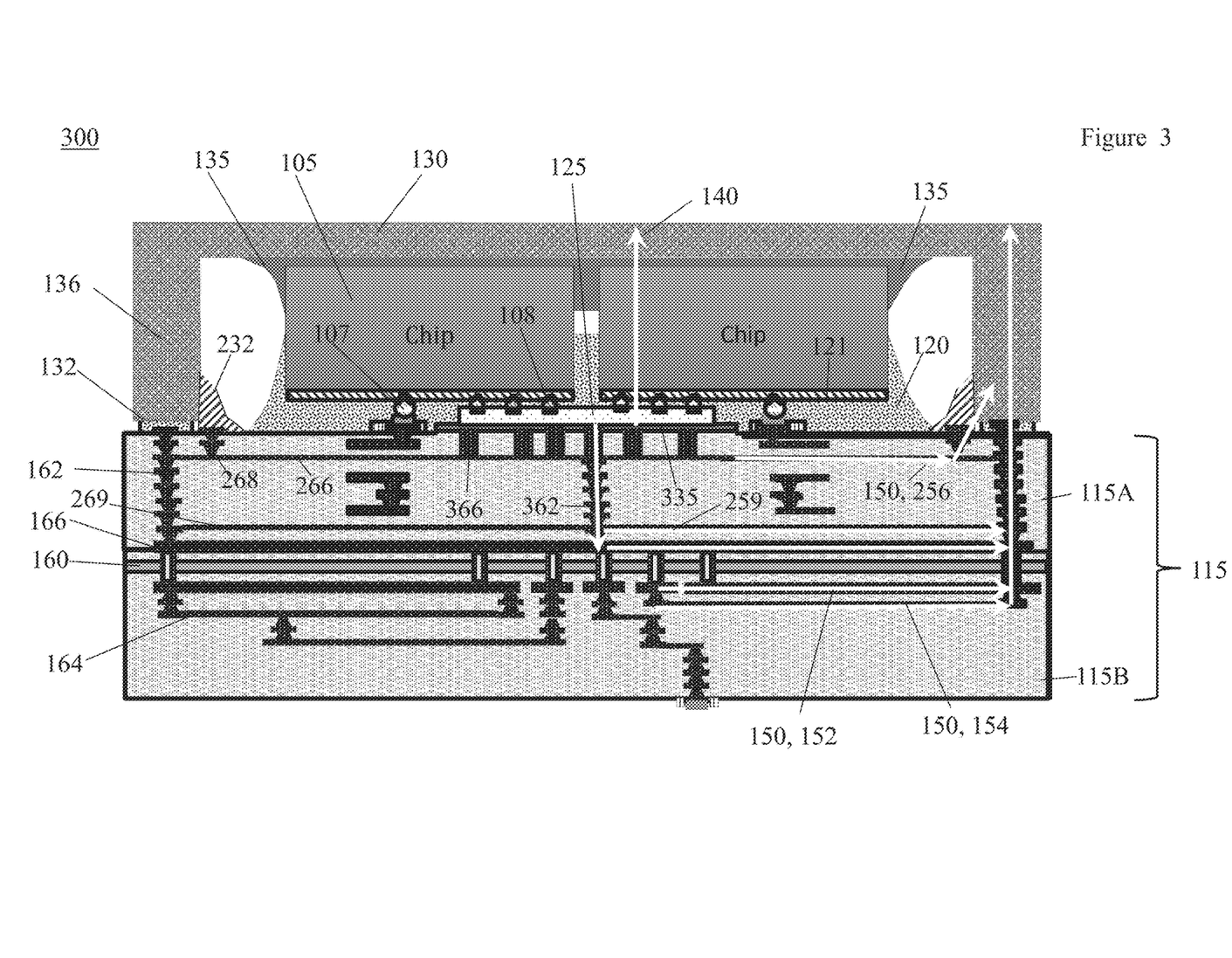
FIG. 3 is an elevation view of an alternative embodiment of a semiconductor package having two or more chips with a bridge not in a cavity.

FIG. 3 is an elevation view of an alternative embodiment of a semiconductor package 300 having two or more chips 105 with a bridge 125 not in a cavity.

In this embodiment, there is no cavity/trench 175 in which the bridge 125 fits. Instead the bridge 125 is disposed on a layer of TIM 335 which is disposed on a portion of the surface 116 of the substrate 115. The TIM 335 can be in grease, gel, or film form. In this embodiment, one or more short vias 366 penetrate the surface of the substrate 115 and are in thermal contact with the TIM 335. In some embodiments, the short vias 366 also are in thermal contact with a substrate heat conduction paths like 226 which conduct heat through the horizontal layer heat conduction paths to the additional vias 268 and the stacked, vertical vias 162.

In addition, one or more main vertical vias 362 thermally connects the TIM 335 to horizontal layer heat conduction paths, e.g. 269, 166, and 160 that conduct heat (e.g. 259) to the extremities of the package 300. In some embodiments, the main vertical via 362 has a larger cross-sectional area to enable conduction of the aggregate heat gathered by a plurality of short vias 366. Multiple main vertical vias 362 can also be used to increase heat conduction.

Figure 4:
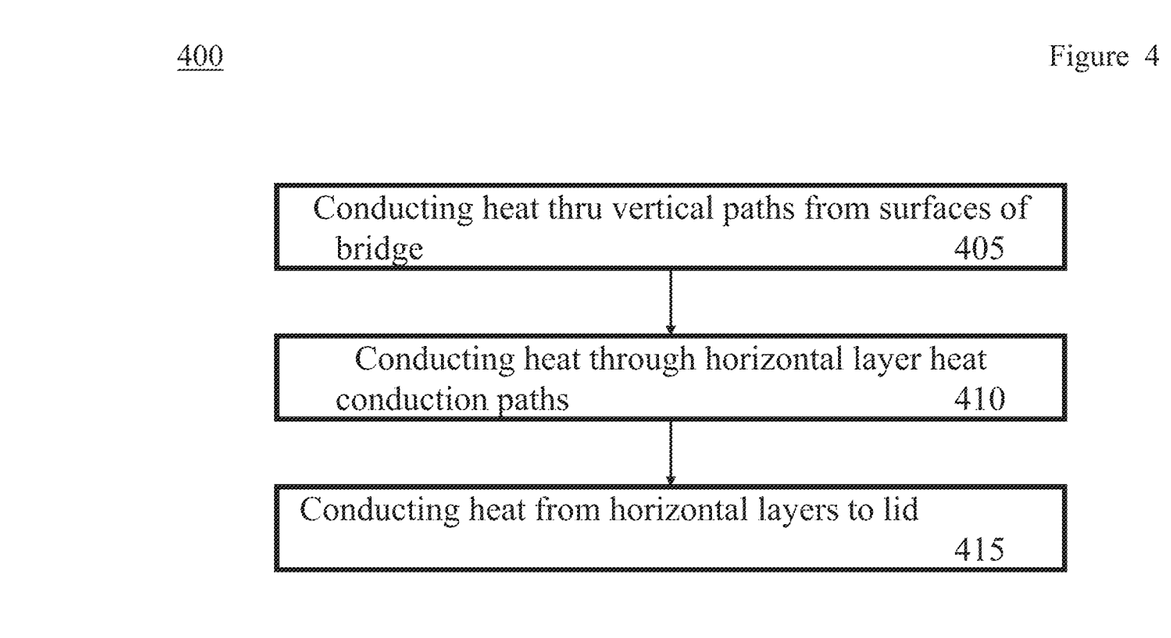
FIG. 4 is a flow chart showing a heat flow process in a semiconductor package having two or more chips, a bridge, and a laminated substrate.

FIG. 4 is a flow chart showing a heat flow process 400 in a semiconductor package (e.g., 100, 200, 300) having two or more chips 105, a bridge 125, and a laminated substrate 115.

The process 400 begins with step 405 which is the conducting heat through one or more vertical paths (e.g., 168, 362, 366) from one or more surfaces of the active bridge 125. The vertical paths are not proximate to the semiconductor chips 105.

Step 410 performs the conducting of heat from the vertical paths through one or more horizontal layer heat conduction paths and then to one or more outer edges of the semiconductor package.

Step 415 performs the conducting of heat from one or more of the horizontal layer heat conduction paths through one or more vertical paths at the extremities of the package, e.g. stacked vias 162. In some embodiments, the heat is conducted into one or more legs 136 of a heat conducting lid 130 where it is dissipated into the ambient environment.

The descriptions of the various embodiments of the present invention have been presented for purposes of illustration but are not intended to be exhaustive or limited to the embodiments disclosed. Given this disclosure, many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A semiconductor package comprising:
   two or more semiconductor chips, each chip having one or more external electrical connections;
   one or more passive or active bridges, the bridges electrically connecting at least one of the electrical connections on a first chip to an electrical connection on a second chip, the active bridge producing heat while the chips and the active bridge are operating;
   a laminated substrate, the laminated substrate having a laminated substrate surface and one or more horizontal heat conduction paths, the laminated substrate further comprising one or more vertical substrate heat conduction paths that collect heat from one or more of the horizontal heat conduction paths and conduct the heat out of the semiconductor package;
   a layer of TIM disposed on the laminated substrate surface between the laminated substrate and one or more of the active bridges,
   wherein some of the heat produced by the one or more of the active bridge is conducted away from the chips to one or more of the horizontal layer heat conduction paths.

2. A package, as in claim 1, where one or more of the horizontal layers is a plane of material with high heat conductivity.

3. A package, as in claim 1, where one or more of the vertical substrate heat conduction paths is made of vias that are either vertically stacked or offset vertically.

4. A package, as in claim 1, where one or more of the horizontal layers is one or more conductive lines of material with high heat conductivity.

5. A package, as in claim 1, where two or more of the horizontal layers have different cross-sectional areas.

6. A package, as in claim 5, where the cross-sectional areas are determined by an amount of heat conducted through them.

7. A package, as in claim 4, where the conductive lines are metal lines made of Copper (Cu).

8. A semiconductor package comprising:
   two or more semiconductor chips, each chip having one or more external electrical connections;
   one or more active bridges, the active bridge electrically connecting at least one of the electrical connections on a first chip to an electrical connection on a second chip, the active bridge producing heat while the chips and active bridges are operating;
   a laminated substrate, the laminated substrate having a surface, one or more horizontal dielectric layers and one or more horizontal layer heat conduction paths with high heat conductivity, the laminated substrate further comprising one or more vertical substrate heat conduction paths that collect heat from one or more of the horizontal layer heat conduction paths and conduct the heat out of the semiconductor package, where the heat produced by the active bridge is conducted away from the chips;
   a layer of TIM disposed on the surface between the laminated substrate and one or more of the active bridges;
   one or more main vertical vias thermally connecting one or more of the active bridges through the layer of TIM to one or more of the horizontal layer heat conduction paths and
   a lid made of heat conducting material, the lid having one or more legs, at least one of the legs thermally connected to a top of the laminated substrate and the lid in thermal contact with one or more of the chips.

9. A package, as in claim 8, where at least one of the legs is thermally connected to an outer edge of the laminated substrate.

10. A package, as in claim 8, where one or more vertical substrate heat conduction paths conducts heat to one or more legs of the lid, the leg being thermally connected at an edge of the laminated substrate.

11. A package, as in claim 8, further comprising one or more cavities in the surface of the laminated substrate where the bridge is disposed within the cavity.

12. A package, as in claim 11, where a heat conductive thermal interface material (TIM) covers a bottom and one or more sides of the bridge to provide a conductive path for heat passing through one or more surfaces of the bridge.

13. A package, as in claim 12, further comprising a plurality of additional vias in thermal contact with the bridge through the TIM and the additional vias conducting heat to one or more of the horizontal layer heat conduction paths.

14. A package, as in claim 8, further comprising:
   a heat conductive paste in contact with the legs and the laminated substrate surface, the heat conductive paste increasing a surface area contact between the legs and the surface of the laminated substrate; and
   one or more additional vias that conduct heat from one or more of the horizontal layer heat conduction paths through the heat conductive paste to the legs.

15. A package, as in claim 8, further comprising a plurality of short vias thermally connecting the bridge through the layer of TIM to one or more horizontal layer heat conduction paths.

16. A package, as in claim 8, where the horizontal layer heat conduction paths comprise one or more of the following: a heat conductive plane, a conductive line, and a group of conductive lines.

17. A package, as in claim 8, where there are a plurality of vertical substrate heat conduction paths connecting the legs to the same horizontal layer heat conduction paths.

18. A method of transferring heat from an active bridge within a. semiconductor package comprising the steps of:
   conducting heat through one or more vertical paths from one or more surfaces of the active bridge, none of the surfaces adjacent to a semiconductor chip;

conducting heat from the vertical paths to one or more horizontal layer heat conduction paths to one or more outer edges of the semiconductor package; and conducting heat from one or more of the horizontal layer heat conduction paths through one or more stacked vias to one or more legs of a heat conducting lid.

\* \* \* \* \*